United States Patent [19]

Koide

[11] Patent Number: 5,041,302

[45] Date of Patent: Aug. 20, 1991

[54] METHOD OF FORMING THIN FILM BY PHYSICAL VAPOR DEPOSITION

[75] Inventor: Hiroshi Koide, Nagoya, Japan

[73] Assignee: Chyunichi Sangyo Co., Ltd., Aichi, Japan

[21] Appl. No.: 489,770

[22] Filed: Mar. 2, 1990

Related U.S. Application Data

[63] Continuation-in-part of Ser. No. 244,687, Sep. 15, 1988, abandoned, which is a continuation-in-part of Ser. No. 93,090, Aug. 31, 1987, abandoned.

[30] Foreign Application Priority Data

Sep. 5, 1986 [JP] Japan .................................. 61-210073

[51] Int. Cl.$^5$ .............................................. B05D 3/06
[52] U.S. Cl. ...................................... 427/38; 427/124; 427/294; 427/314
[58] Field of Search ................... 427/38, 124, 294, 314

[56] References Cited

U.S. PATENT DOCUMENTS 4,451,501 5/1984 Nagao et al. ........................ 427/129

*Primary Examiner*—Bernard Pianalto
*Attorney, Agent, or Firm*—Browdy and Neimark

[57] ABSTRACT

In method of forming a thin film by physical vapor deposition wherein a thin film material is evaporated in a vacuum thereby vapor particles deposit to a surface of a substrate and the thin film is formed, an electrode is arranged near the substrate with good conductivity and low voltage is applied between the substrate and the electrode thereby charges are induced on a growth step of the thin film being formed by the vapor particle group on the surface of the substrate, and the ionized vapor particles of the thin film material introduced in a space between the substrate and the electrode are continuously attracted and made adhere to the growth step inducing charges at low speed because of the low voltage so that the thin film is formed.

Charges are induced on the growth step of the thin film by applying low voltage and the ionized vapor particles of the thin film material are subjected to the attraction of the growth step on the substrate, thereby the particles are directed to the growth step and collide with the substrate at low speed and continuously adhere to the growth step.

Consequently, the thin film formed on the substrate becomes single crystal or the crystal state close to single crystal so that excellent semiconductor device or the like can be obtained.

7 Claims, 1 Drawing Sheet

METHOD OF FORMING THIN FILM BY PHYSICAL VAPOR DEPOSITION

This application is a continuation-in-part, of application Ser. No. 07/244,687, filed Sep. 15, 1988, now abandoned which is a continuation-in-part, of application Ser. No. 093,090, filed Aug. 31, 1987, now abandoned.

BACKGROUND OF THE INVENTION

The present invention relates to method of forming a thin film on a surface of a substrate by physical vapor deposition.

In the prior art, ion plating method or cluster ion beam method is also known as physical vapor deposition and the thin film which is formed by this method. In such method, a material which is to form a thin film is evaporated, and particles of the vapor are ionized; the ionized vapor particles are accelerated by applying high voltage between the evaporation source and the substrate. The particles supplied with large kinetic energy collide with the substrate, thereby forming a strongly adhering film on the substrate.

It is known that the thin film formed by the ionized vapor particles has excellent crystal properties in comparison with the thin film obtained without ionizing the vapor particles. This is because the former has the large kinetic energy supplied to the ions.

However, the thin film formed in such method is apt to be deposited in a polycrystalline state rather than a monocrystalline state.

That is, as shown in FIG. 2, an ionized vapor particle 1 of thin film material flies towards a substrate 4 along dotted line by means of attraction of charges induced on growth steps 2, 3 of a thin film being formed on a surface of the substrate 4. When the vapor particle 1 is sufficiently close to the substrate 4, the vapor particle 1 is subjected to the attraction of the nearer growth step 2 and varies the orbit of the dotted line and is directed towards the growth step 2. However, since application of the high voltage is maintenance, the vapor particle 1 is accelerated into high speed and therefore cannot attain the growth step 2 but collides with certain position 5 of the substrate 4. Subsequently, it is preferable that the vapor particle 1 can be moved to the growth step 2 according to the kinetic energy supplied to the vapor particle 1. If the vapor particle 1 cannot be moved to the growth step 2, it stops at the position 5 on the surface of the substrate 4 with which the vapor particle 1 collides or at any position between the position 5 and the growth step 2. New growth of the thin film starts from the stop position of the vapor particle 1. Thus the formed thin film becomes polycrystalline, i.e. a collection of many fine crystals but does not become a thin film of single crystal.

The vapor particle 1 of the thin film material in this case an atom or molecule of the thin film material or a fine atomic group as a collection of several atoms in the ion plating, or a massive atomic group (cluster) where atoms of several thousands or less in number of the thin film material are loosely coupled in the cluster ion beam method.

As above described, the thin film of single crystal or that close to single crystal cannot be formed by a conventional method. Particularly, in the semiconductor technology, the thin film of single crystal of semiconductor must be formed on the substrate. However, since the thin polycrystalline film of is formed in the conventional method, this method cannot be used to produce semiconductor device.

SUMMARY OF THE INVENTION

An object of the invention is to provide a method of forming a thin film wherein the speed of the ionized vapor particles of the thin film material in direction of the substrate is made slow in comparison to the conventional method and therefore the vapor particles can easily attain the growth step so that the thin film of a single crystal, or that having an excellent crystalline property being close to that of a single crystal, can be formed.

In order to attain the above object, the invention improves physical vapor deposition method where a thin film material is evaporated in a vacuum whereby the vapor particles deposit on a surface of substrate and a thin film is formed, wherein an electrode is arranged near the substrate of good conductivity and low voltage is applied between the substrate and the electrode. In this manner charges are induced on the growth step of the thin film which are formed by the vapor particle group on the substrate surface, and the ionized vapor particles of the thin film material introduced in a space between the substrate and the electrode are continuously attracted and made to adhere to the growth step inducing charges at low speed according to the low voltage so that a thin film is formed.

DESCRIPTION OF THE PREFERRED EMBODIMENT

Figure 1:
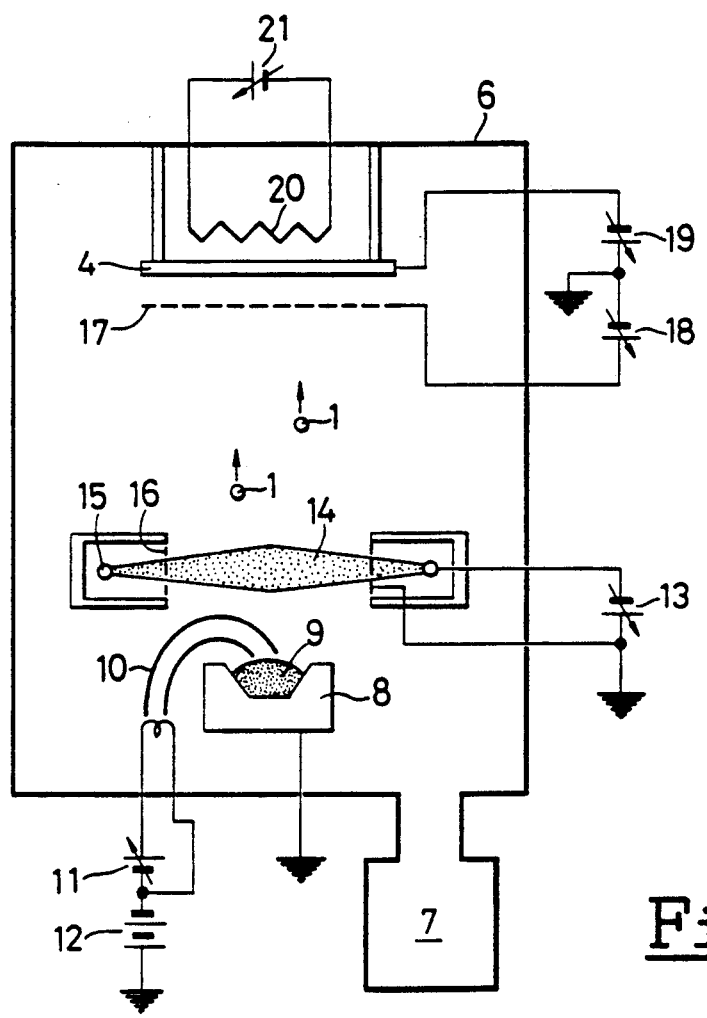
FIG. 1 is a schematic diagram of an embodiment of a thin film forming apparatus illustrating the invention.
Figure 2:
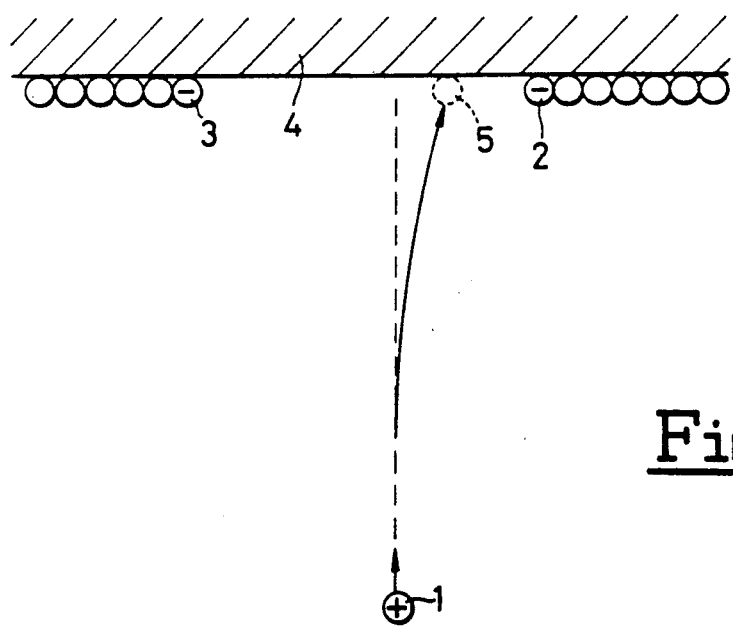
FIG. 2 is a schematic diagram of thin film forming method in the prior art schematically illustrating portion near a substrate.

An embodiment of the invention will be described in detail referring to outline of an embodying apparatus example shown in FIG. 1.

A substrate 4 is arranged on upper side of a vacuum tank 6, and a heater 20 heated by a power source 21 is installed close to the substrate 4 and a grid-shaped electrode 17 is arranged near lower side of the substrate 4. Numerals 18, 19 designate a variable DC power source which applies low voltage between the substrate 4 and the electrode 17 so as to induce charges on a surface of the substrate 4.

Numeral 7 designates a vacuum exhaust device which evacuates the vacuum tank 6. Numeral 8 designates an electron beam evaporation source which conductively connects an electron beam 10 connected to a power source 11, 12. Numeral 15 designates an electron emission filament for ionization which is arranged between the substrate 4 and the electron beam evaporation source 8 in opposition to portion near the electron beam evaporation source 8. Thermoelectrons are emitted from the filament 15 through a grid 16 by means of a power source 13 connected thereto so that state of an electron shower 14 is produced.

Next, an example of a method of forming a thin film according to the embodiment will be described. Silicon 9 as a thin film material is enclosed in the electron beam evaporation source 8 and the vacuum exhaust device 7 is operated so as to evacuate the vacuum tank 6. On the other hand, respective power sources 11, 12, 13, 18, 19, 21 are turned on so that the substrate 4 is heated and a low voltage is applied between the substrate 4 and the electrode 17. At the same time, thermoelectrons emitted from the electron emission filament 15 result in an electron shower 14, and the silicon 9 enclosed in the electron beam evaporation source 8 is heated and evaporated.

In such state, vapor particles 1 of the silicon 9 are directed to the substrate 4 but are subjected to the electron shower 14 midway so that at least a part thereof is ionized. Subsequently the ionized vapor particle 1 passes through the grid of the electrode 17 with the low voltage of positive polarity applied thereto so as to decelerate the ionized vapor particle 1 and then is introduced between the substrate 4 and the electrode 17. On the other hand, the low voltage applied between the substrate 4 and the electrode 17 induces charges on the growth step of the thin film being formed on the surface of the substrate 4 by the vapor particle group already attained.

Consequently, the ionized vapor particles 1 are directed to the growth step by the attraction of the charge at low speed caused by the low voltage and attract the vapor particles not yet ionized. The vapor particles 1 together with those not yet ionized collide with the substrate 4 and continously adhere to the growth step. This continouous adhesion forms the thin film of silicon on the surface of the substrate 4.

Since the voltage to be applied between a substrate 4 and the electrode 17 may be of the field intensity sufficient to induce charges on the growth step of the thin film, it may be considerably low voltage.

As to this point, in the ion plating method, high voltage of several kV is applied between the evaporation source of the thin film material and the substrate. For example, if the distance between the evaporation source of the thin film material and the substrate is 50 cm and the voltage is 3 kV, the field intensity will become 60 V/cm.

On the contrary, in the preferred embodiment, if the distance between the substrate 4 and the electrode 17 is 1 cm, the applied voltage of only 60 V will do in order to obtain the field intensity of 60 V/cm being equal to that in the previous case.

In other words, when the vapor particles 1 of the thin film material are ionized into positive ions in the preferred embodiment, if voltage of plus 5 V for example is applied to the electrode 17 so as to decelerate the ionized vapor particles, voltage of minus 55 V may be applied to the substrate 4. Consequently, although the ionized vapor particles are slowly accelerated by the low voltage applied between the substrate 4 and the electrode 17, the speed is quite low in comparison to conventional method and therefore the number of the vapor particles which can attain the growth step increases and the nucleus of growth decreases. Consequently, a thin film having good crystalline property and being close to a single crystal can be formed in comparison to the conventional method.

In the conventional method, if the speed of the ionized vapor particles towards the substrate is to be reduced the acceleration voltage must be made low. In this case, however, sufficient charges are not induced on the growth step and the ionized vapor particles cannot attain the growth step and therefore the crystalline property of the thin film becomes worse.

Although the embodiment is constituted as above described, various changes and modifications may be made in the invention within the scope of the accompanying claims. For example, the substrate may be made of any material as long as it is good conductor. In addition to metal, semiconductor or the like, may be used. Since any material whose conductivity becomes good at heating it to temperature near the melting point will do, use of insulation material such as silicon oxide, aluminum oxide, silicon nitride, titanium carbide or silicon boride becomes possible. Particularly, if the substrate is heated, irrespective of its material, the vapor particles move easily on the substrate to the growth step. In this case, the method of heating the substrate may be by resistance heating, induction heating, infrared heating, electron beam heating, laser heating, ion beam heating or combination use of these. Similar heating method may be adopted also in the evaporation source of the thin film material. Further, the substrate may be of not only plane form but also solid form, and the form of the electrode may be fitted to the substrate form.

The thin film material also may be selected suitably. In addition to semiconductor materials such as silicon or germanium and metals such as aluminum, gold or platinum, inuslation materials such as silicon oxide or silicon nitride may be used because the conductivity becomes good by heating. Compound semiconductors such as gallium arsenide or alloy may be used. In this case, an evaporation source for exclusive use of each element may be installed. In order to dope the impurity to the thin film, the evaporation source for exclusive use of the doping may be separately installed.

The substrate and the electrode arranged near it may be arbitrarily selected in voltage and distance. The electrode may be of grid form, or otherwise may be of slit form or a porous plate if the vapor particles can be transmitted through it. Although the electrode is at plus potential in the embodiment, it may be at the ground potential or at minus potential so as to accelerate the ionized vapor particles. In this case, the anode of the power source 19 shown in FIG. 1 is not grounded but may be directly connected to the electrode 17. In order to prevent the thickness of the thin film from becoming not uniform by the shade of the electrode, the thin film may be formed while the electrode or the substrate is being moved.

Ionization of the vapor particles of the thin film material may be performed not only by the electron shower but also by RF discharge, DC discharge, arc discharge or glow discharge or by a combination of these. According to the electron beam, one apparatus can perform the evaporation of the thin film material and the ionization. In order to deflect the ionized vapor particles, a magnetic field or an electric field may be installed, or in order to focus the ionized vapor particles an electrostatic lens or a magnetic lens may be used.

Although ionization of the vapor particles of the thin film material is preferably applied to all vapor particles if possible, the ionization of only a part of the vapor particles will do. After applying a mass spectrometry thereto, if the ionized vapor particles only are introduced between the substrate and the electrode, a thin film with excellent crystalline properties and high purity can be formed.

Further, although the vapor particle seems in atomic form in the embodiment, it may be in molecular form, in the form of a fine atomic group or a massive atomic group (cluster).

Although the evaporation source side of the thin film material is at the ground potential in the embodiment, the substrate side may be at the ground potential.

When the vapor particles are ionized into negative ions in reverse to the preferred embodiment, only the polarity of voltage is changed and there is no essential difference.

According to the invention as above described, the electrode is arranged near the substrate and low voltage is applied. The charges are induced on the growth step being formed in the thin film of the substrate, and the speed of the ionized particles directed at the substrate may be made low because of the low voltage, so that the particles are continuously made to adhere to the growth step inducing charges and a thin film with excellent crystalline properties can be formed. Particularly, the invention has a large effect in that the thin film for the semiconductor device can be formed well. Also the high voltage source for ion acceleration becomes unnecessary and therefore effects are obtained in facilities.

The ion plating method referred to as a turn-in of vapor particles has also been found to be effective. For example, when a substrate has a hole therein, the conventional method of plating without the ionizing vapor particles cannot deposit a thin film of coating material on the walls of the hole, because the flow of the vapor particles and the wall are in the same direction. On the other hand, the ion plating method can deposit a thin film of coating material on the wall of the hole, since the ions are attracted by the charges on the wall. However, because the speed of the ions is very rapid, most of the ions pass the wall and are deposited on the bottom of the hole, so that the thin film formed on the wall by the ion plating method is very thin, and is generally not of a sufficient thickness for the uses for which it is intended. If the deposit time is extended to ensure a film of sufficient thickness, the other regions of the substrate are exposed to ion bombardment for too long a period of time, and the coating thickness on these areas is excessive. Therefore, a surface of the other region is roughened by ion collision or melted by ion heating.

In the present invention, an electrode is arranged near the substrate and a low voltage is applied between the substrate and the electrode, thereby including charges on the surface of the substrate or forming a thin film, and the ions are attracted by the charges and deposit onto the surface of the substrate or form a thin film thereon. Consequently, the ion speed of the present invention is slow because of the reduced voltage, so that the method of the present invention can be used to deposit a thick film onto the wall of the hole in a short period of time, and the low speed of the ions does not roughen or melt the surface of the other regions of the substrate.

In addition to the above situation, there are many cases in which the substrate cannot be subjected to heating, e.g., where a part of the substrate is made of a plastic having a low melting point. The method of the present invention is particularly effective in these cases. Moreover, when the substrate is in a planar form, the present invention can provide a thin film having a smooth surface because of the low speed of the ions.

The important aspect of the present invention is the use of a low voltage power source. Because a high voltage power source as required by the ion plating method is expensive and consumes a great deal of electricity, the method of the present invention is superior to that of the ion plating method in that a thin film having a velvety surface is obtained with much lower consumption of energy and good turn-in at low temperature, and the maintenanace cost of such power source is very low.

What is claimed is:

1. A method for forming a thin film having the properties of a single crystal by physical vapor deposition wherein a thin film material is evaporated in a vacuum to form vapor particles which are deposited onto the surface of a substrate, comprising:
   arranging an electrode near the substrate, said substrate having good electrical conductivity;
   applying low voltage between the substrate and the electrode so as to induce charges on the surface of the substrate to form a thin film;
   whereby ionized vapor particles of the thin film material are introduced into a space between the substrate and the electrode, and said particles are continuously attracted and made to adhere to the surface of the substrate and thereby form a film having the properties of a single crystal.

2. The method according to claim 1 wherein the low voltage is less than one thousand volts.

3. The method according to claim 1 wherein the voltage is in the range of from 55 V/cm$^2$ to about 60 V/cm$^2$.

4. The method according to claim 1 wherein insulation material is heated whereby a substrate holding electric conductivity is formed.

5. The method according to claim 1 wherein insulation material is heated, whereby a thin film material holding electric conductivity is formed.

6. The method according to claim 1 wherein the thin film material is a metal.

7. The method according to claim 1 wherein the thin film material is a semiconductor.

* * * * *

UNITED STATES PATENT AND TRADEMARK OFFICE
CERTIFICATE OF CORRECTION

PATENT NO. : 5,041,302

DATED : August 20, 1991

INVENTOR(S) : Hiroshi Koide

It is certified that error appears in the above-identified patent and that said Letters Patent is hereby corrected as shown below:

Column 1, line 13, after "deposition" insert --and the thin film which is formed by this method--.

Column 6, after line 20, please add the following:
--In the ion plating method, a thin film is sputtered by high speed ions. That is, the thin film of coating material is driven out from the surface of the substrate. Therefore, the ion plating method requires a long time for deposit, and many coating materials. Then, the sputtered coating material is deposited as a contaminant on other regions of the vacuum tank, so that cleaning of apparatus and the vacuum tank are often required in the ion plating method, and maintenance of the apparatus for this method is very troublesome.
As has been described above, the ion speed of the present invention is slow because of the low voltage, so that the thin film formed is not sputtered. Consequently, the method of the present invention can deposit a thin film in a shorter time with less coating material than the ion plating method, and does not contaminate the vacuum tank.--

IN THE CLAIMS:
Cancel claim 3.

Signed and Sealed this

Twenty-third Day of March, 1993

Attest:

STEPHEN G. KUNIN

Attesting Officer

Acting Commissioner of Patents and Trademarks